(12) United States Patent
Ko et al.

(10) Patent No.: US 7,700,393 B2
(45) Date of Patent: Apr. 20, 2010

(54) METHOD OF MANUFACTURING ENHANCEMENT TYPE SEMICONDUCTOR PROBE AND INFORMATION STORAGE DEVICE HAVING THE SEMICONDUCTOR PROBE USING THE SAME

(75) Inventors: Hyoung Soo Ko, Seoul (KR); Byung Gook Park, Seoul (KR); Seung Bum Hong, Seongnam-si (KR); Chul Min Park, Yongin-si (KR); Woo Young Choi, Yongin-si (KR); Jong Pil Kim, Yongin-si (KR); Jae Young Song, Yongin-si (KR); Sang Wan Kim, Yongin-si (KR)

(73) Assignees: Samsung Electronics Co., Ltd., Suwon-si (KR); Seoul National University Industry Foundation, Seoul (KR)

( * ) Notice: Subject to any disclaimer, the term of this patent is extended or adjusted under 35 U.S.C. 154(b) by 144 days.

(21) Appl. No.: 12/043,982

(22) Filed: Mar. 7, 2008

(65) Prior Publication Data

US 2008/0220556 A1 Sep. 11, 2008

(30) Foreign Application Priority Data

Mar. 7, 2007 (KR) ...................... 10-2007-0022550

(51) Int. Cl.
*H01L 21/00* (2006.01)
(52) U.S. Cl. .............................. 438/42; 438/22; 438/48
(58) Field of Classification Search ................... 438/22, 438/42, 48
See application file for complete search history.

(56) References Cited

U.S. PATENT DOCUMENTS 6,027,951 A * 2/2000 MacDonald et al. .......... 438/20
6,566,245 B2 * 5/2003 Deas et al. .................. 438/624

* cited by examiner

*Primary Examiner*—Richard A. Booth
(74) *Attorney, Agent, or Firm*—Sughrue Mion, PLLC

(57) ABSTRACT

A method of manufacturing an enhancement type semiconductor probe and an information storage device having the enhancement type semiconductor probe are provided. The method involves using an anisotropic wet etching and a sidewall in which influence of process parameters upon the performance of a device is reduced to improve reliability of the device in mass-production, and factors of degrading measuring sensitivity is removed to improve the performance of the device.

10 Claims, 15 Drawing Sheets

METHOD OF MANUFACTURING ENHANCEMENT TYPE SEMICONDUCTOR PROBE AND INFORMATION STORAGE DEVICE HAVING THE SEMICONDUCTOR PROBE USING THE SAME

CROSS-REFERENCE TO RELATED APPLICATIONS

This application claims priority from Korean Patent Application No. 2007-0022550, filed on Mar. 7, 2007 in the Korean Intellectual Property Office, the disclosure of which is incorporated herein by reference.

BACKGROUND OF THE INVENTION

1. Field of the Invention

The present invention relates to a method of manufacturing an enhancement type semiconductor probe and an information storage device having the enhancement type semiconductor probe using the same method.

More particularly, the present invention relates to a method of manufacturing an enhancement type semiconductor probe using an anisotropic wet etching and a side-wall. In the method, influence of process parameters upon the performance of a device is reduced to improve reliability of the device in mass-production, and factors of degrading measuring sensitivity is removed to improve the performance of the device.

Further, the present invention relates to an information storage device having the enhancement type semiconductor probe using the same method.

2. Description of the Prior Art

Recently, ferroelectric materials have been used in many applications. To read-out information stored in the ferroelectric materials, various devices have been studied and developed. As compared to other detector devices, a resistant probe shows high sensitivity and resolution and is very convenient in utilization.

However, a presently used process of manufacturing a device has a high possibility of changing in device performance according to process parameters, and has a problem in that the performance of the probe is degraded below a level projected for the reason to be described later. Thus, as regards future development of a probe in consideration of commercialization thereof, it needs a process method having higher sensitivity and resolution and being lightly influenced by the process parameters.

Hereinafter, a related art method of manufacturing a semiconductor probe and problems thereof will now be explained in detail with reference to the accompanying drawings.

FIGS. 1A to 1J are sectional process views illustrating a related art method of manufacturing a semiconductor probe having a resistance tip.

First, as shown in FIG. 1A, a mask layer 13 such as a silicon oxide or a silicon nitride is formed on the surface of a silicon substrate 11 or a silicon on insulator (SOI) substrate, doped with first impurities, a photosensitive agent 15 is applied thereon, and a stripe type mask 18 is placed thereon.

Next, exposure, shaping and etching are performed to carry out patterning. Through the photolithography and etching, as shown in FIG. 1B, a stripe type mask layer 13a is formed on the substrate 11, and an area other than the mask layer 13a is highly doped with second impurities to form first and second semiconductor electrode regions 12 and 14.

Next, annealing is performed to reduce a width between the first and second semiconductor electrode regions 12 and 14 below a width of the mask layer 13a. As shown in FIG. 1C, when the heavily-doped regions 12 and 14 of the second impurities are enlarged, the second impurities are diffused into a region adjacent to the heavily-doped regions to form a lightly-doped region of the second impurities. That is, resistance regions 16 are formed. The resistance regions 16 under the mask layer 13a are in contact with each other to form a peak-formation portion of a resistance tip.

Next, a photosensitive agent 19 is applied onto the upper face of the substrate 11 to cover the mask layer 13a and, as shown in FIG. 1D, a stripe type photo mask 20 is placed thereon so as to be crossed at a right angle with the mask layer 13a. Then, the exposure, development and etching are performed to form a photosensitive layer 19a having the same type as the photo mask 20 (See FIG. 1E).

Next, the mask layer 13a that is not covered with the stripe type photosensitive layer 19a is dry-etched to form a rectangular mask layer 13b (See FIG. 1F).

Then, as shown in FIG. 1G, the photosensitive layer 19a is removed and the substrate 11 is wet or dry-etched using the rectangular mask layer 13b as a mask to thereby locate the first and second semiconductor electrode regions 12 and 14 on an inclined face of a tip 10 and to arrange the resistance regions 16 as a peak portion of a tip (See FIG. 1H).

Next, when the substrate 11 is annealed under an oxygen atmosphere after the mask layer 13b is removed, a silicon oxide (not shown) having a certain thickness is formed on the substrate 11. When the oxide is removed, the end point of the resistance regions 16 are sharpened. Then, through performing a thermal oxidation process, the isolated resistance regions 16 can be overlapped together with sharpening of the tip.

Next, as shown in FIG. 1I, a dielectric layer 30 is deposited on the substrate 11 to cover the resistance tip 10. Then, the dielectric layer 30 on the tip 10 is planarized by a chemical-mechanical polishing (CMP). A metal is deposited on the dielectric layer 30 to form a metal shield 32. Next, the metal is removed from a region facing against the resistance regions 16 through a patterning process to form an opening 33 having a certain size on the metal shield 32.

Next, as shown in FIG. 1J, the substrate 11 is etched on its lower face to form a cantilever 40 such that the resistance tip 10 is positioned at its distal end, and the first and second semiconductor electrode regions 12 and 14 are connected to an electrode pad 54 isolated by an insulating layer 52 on the substrate 11, thereby forming a semiconductor probe. Then, an electrode pad 64 for ground voltage is formed on the metal shield 32.

As described above, in the related art method of manufacturing the semiconductor probe having the resistance tip, a pyramid type probe is formed using a mask of a few μm and an isotropic wet etching. In this method, the device performance is greatly varied according to a change in a position and a size of the mask. That is, there are some process parameters in an attempt to make a sharp point of the probe at an exact position using a large mask. The related art method depending on the process parameters as such has a great limit on manufacturing and using a probe commercially. Thus, a factor in reliable manufacturing of a device may be the provision of a mask and an etching method which are comparatively free from the process parameters of the related art. In addition, to this end, a small mask is used from the beginning in manufacturing a device so as to reduce an error factor.

Table 1 below shows the simulation results of the probe sensitivities with respect to mask widths, with 4 μm being the desired mask width.

TABLE 1

| | Mask Width | | |
|---|---|---|---|
| | 4 μm | 4.02 μm | 4.1 μm |
| Sensitivity | 0.031% | 0.02% | 0.017% |

In Table 1, it can be seen that even upon the occurrence of an error in the order of 0.5% from a size intended, the sensitivity is reduced by approximately 30%. The presence of the process parameter affecting the device performance as such places a great limit on the future commercialization of a device, so that such problem should be solved.

Beside the above problem, when the device sensitivity is lower than that intended it causes many possible problems because it results in degradation in performance and the like. It can be analyzed that a cause of such degradation in performance is because source/drain regions that are heavily doped in the process of wet etching are etched and remain as a lightly doped region, so that resistance of the source/drain regions having a large size hardly increases the total current by distribution of electric charges.

The above device can be modeled like in FIG. 2. The model includes resistance Rm, Rs, Rd, R1 and R2. In FIG. 2, since resistances Rs, Rd of the source/drain regions is very large, upon the connection of a voltage source to both ends thereof, variation in total current hardly occurs even upon the occurrence of variation in resistance Rm of the probe tip. In addition, since resistance Rm of the region practically detecting electric charges is much greater than R1 below, most of the current flows to the R1 region so that Rm has little influence on the total current. Thus, to achieve higher device sensitivity, it is required to make Rm much greater than R1 and to make resistances of the source/drain regions reduced.

SUMMARY OF THE INVENTION

Accordingly, the present invention has been made to solve the above-mentioned problems occurring in the prior art, and the present invention provides a method of manufacturing an enhancement type semiconductor probe using an anisotropic wet etching and a side-wall in which influence of process parameters upon the performance of a device is reduced to improve reliability of the device in mass-production, and factors of degrading measuring sensitivity is removed to improve the performance of the device.

Another object of the present invention is to provide an information storage device having the enhancement type semiconductor probe using the above method.

In accordance with an aspect of the present invention, there is provided a method of manufacturing an enhancement type semiconductor probe using an anisotropic wet etching and a side-wall, comprising: forming, on a silicon substrate, a first etching mask pattern for forming a tip portion of a probe in a first direction and a forming side-walls on both sides thereof, anisotropically etching the silicon substrate using the sidewalls to form both inclined faces of the probe; implanting impurities into the silicon substrate using the side-walls as a mask to form source and drain regions and removing the side-walls; forming source and drain regions on the both inclined faces of the probe using the first etching mask pattern as a mask and removing the first etching mask pattern; forming, on the tip portion of the probe, a second etching mask pattern for forming a tip portion of the probe in a second direction; forming spacer layers on both sides of the second etching mask pattern; and etching the silicon substrate in a certain depth by a photolithography using the spacer layers and removing the spacer layers.

The method of forming the first etching mask pattern in the step comprises: sequentially depositing a first etching mask layer, a second etching mask layer, and a photosensitive layer on the silicon substrate; patterning the photosensitive layer and etching the second etching mask layer using a photolithography; removing the photosensitive layer and forming a spacer layer on a side-wall of the second etching mask layer; removing the second etching mask layer and etching the first etching mask layer using the spacer layer; and removing the spacer layer to form the first etching mask pattern.

The first and second etching mask layers each are composed of materials having different etch selectivity.

The first etching mask layer is composed of silicon oxide ($SiO_2$), and the second etching mask layer is composed of nitrides ($SiN_x$).

The method of forming the second etching mask pattern comprises: sequentially laminating a third etching mask layer, a fourth etching mask layer, and a photosensitive layer on the silicon substrate; patterning the photosensitive layer and etching the fourth etching mask layer using a photolithography; removing the photosensitive layer and forming a spacer layer on a side-wall of the fourth etching mask layer; removing the fourth etching mask layer and etching the third etching mask layer using the spacer layer; and removing the spacer layer to form the second etching mask pattern.

The third and fourth etching mask layers each are composed of materials having different etch selectivity.

The third etching mask layer is composed of silicon oxide ($SiO_2$), and the fourth etching mask layer is composed of nitrides ($SiN_x$).

The sidewalls are formed using nitrides ($SiN_x$).

The spacer layers are formed using hydrogen silsequioxane (HSQ).

In accordance with another aspect of the present invention, there is provided an information storage device having one of the enhancement type semiconductor probes manufactured above.

According to the present invention, influence of process parameters upon the performance of a device is reduced to improve reliability of the device in mass-production, and factors of degrading measuring sensitivity is removed to improve the performance of the device.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Figure 1A:
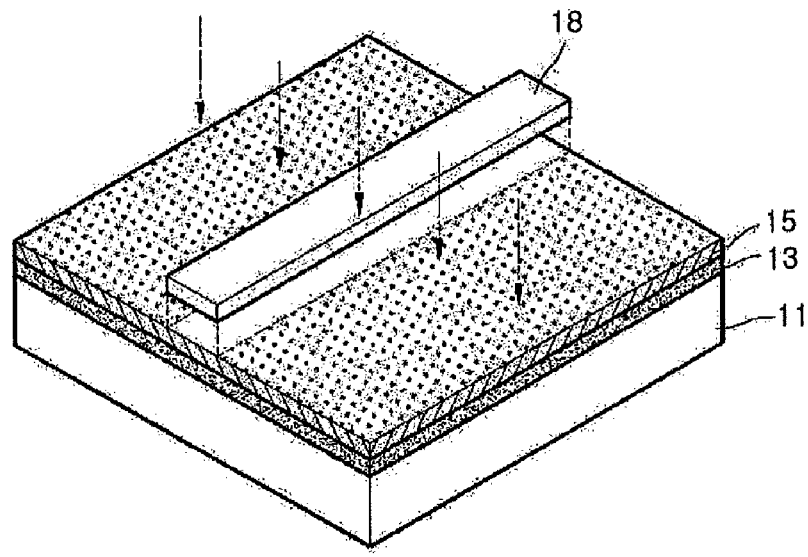
FIGS. 1A to 1J are sectional process views illustrating a related art method of manufacturing a semiconductor probe having a resistance tip.
Figure 1B:
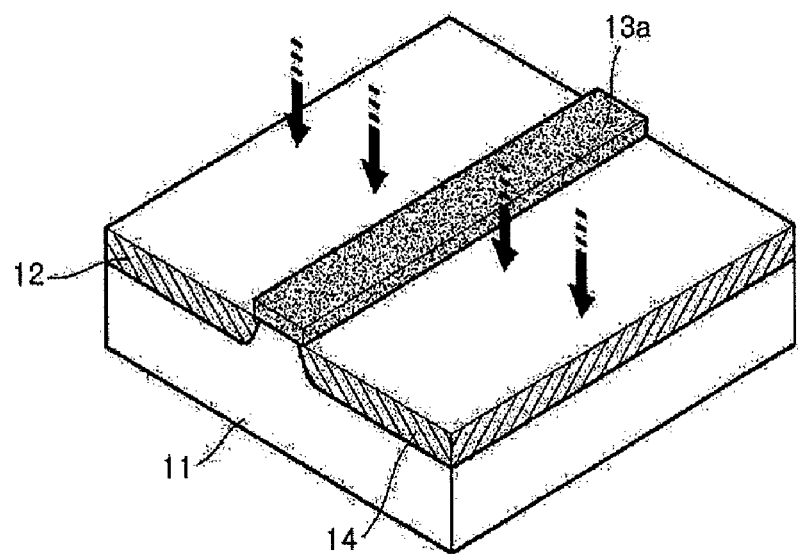
Figure 1C:
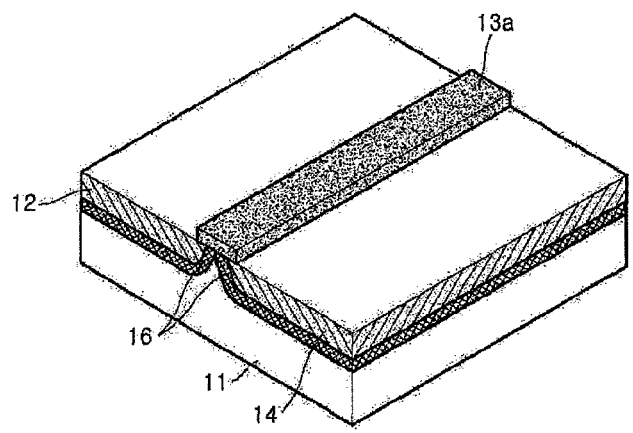
Figure 1D:
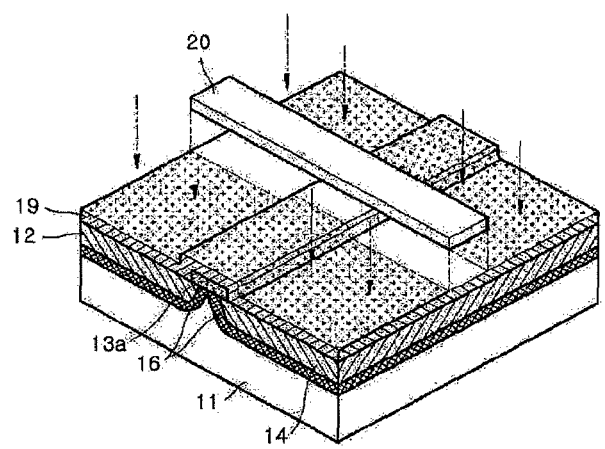
Figure 1E:
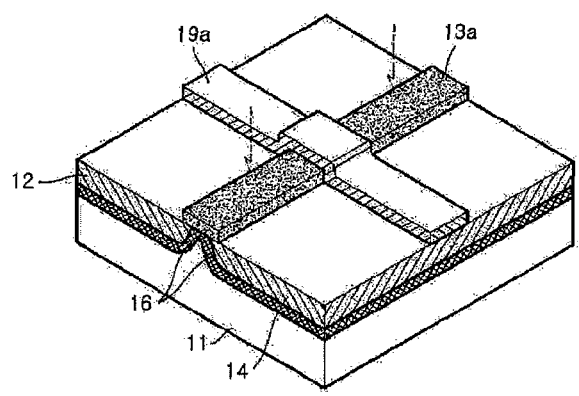
Figure 1F:
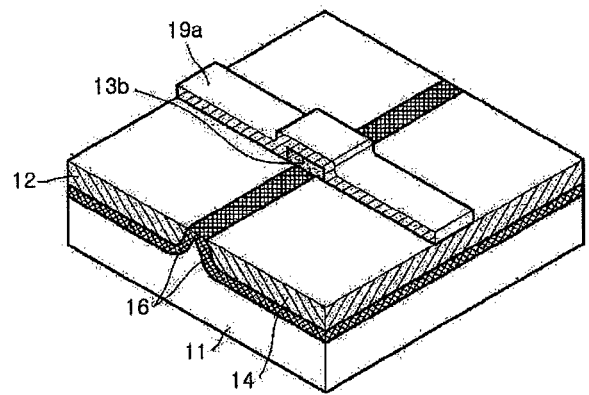
Figure 1G:
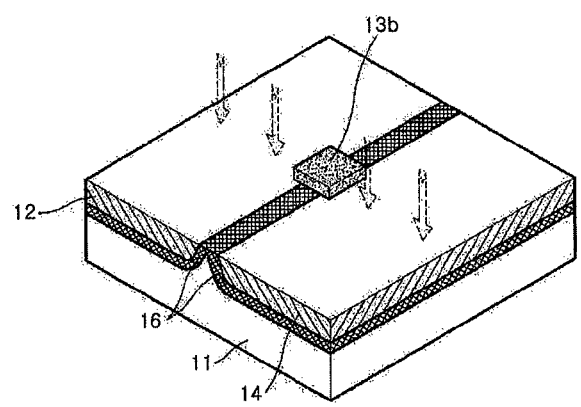
Figure 1H:
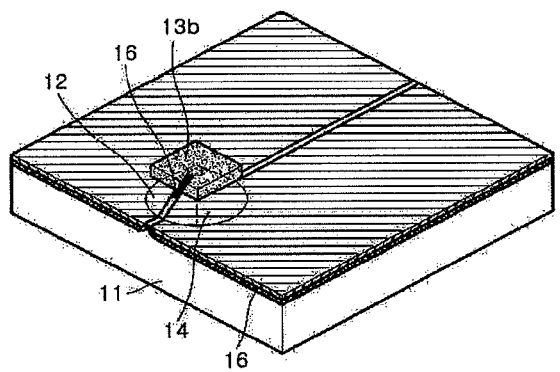
Figure 1I:
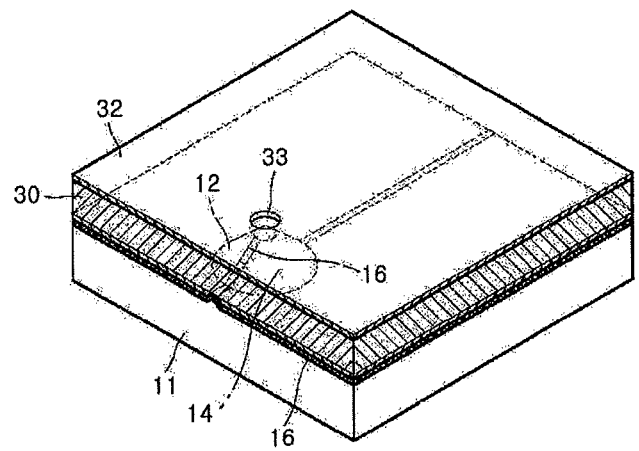
Figure 1J:
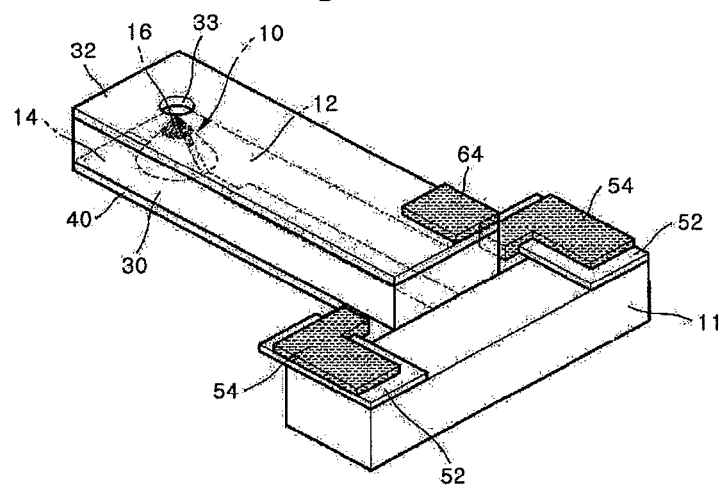
Figure 2:
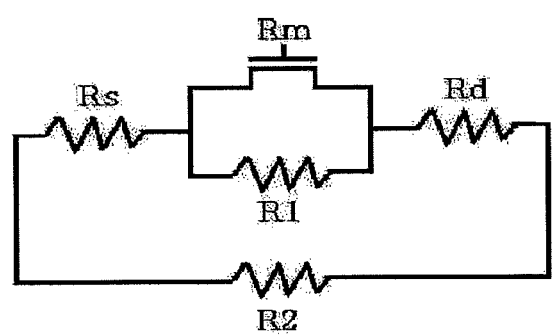
FIG. 2 is a circuitry diagram of the semiconductor probe having the resistance tip.

Hereinafter, an exemplary embodiment of a method of manufacturing an enhancement type semiconductor probe using an anisotropic wet etching and a side-wall and an information storage device having the semiconductor probe manufactured by the method according to the exemplary embodiment of the present invention will be described with reference to the accompanying drawings. In the following description and drawings, the same reference numerals are used to designate the same or similar components, and so repetition of the description on the same or similar components will be omitted.

Example

First, the related art has a problem in that the device performance depends on the process parameters in the process of forming a fine tip portion of a probe using a large mask. To solve this problem, according to an exemplary embodiment of the present invention, a mask for forming a tip is made much smaller from the beginning (See FIG. 3G). To form the mask that can be commercialized while having a small size, a method using a sidewall is adopted.

Next, to reduce resistance through securing heavily-doped source/drain regions, an etching-after-doping method is not used, but a doping-after-etching method is used. To this end, as shown in FIG. 3H, an etching process is performed using sidewalls, and as shown in FIG. 3I, the sidewalls are removed and the lightly-doped source/drain regions are formed using a mask previously manufactured. A transfer method (See FIG. 3Q) is used which does not use an isotropic wet etching that is problematic to reliability or the like, but uses an anisotropic wet etching (See FIG. 3H) using a difference in an etching rate according to a crystalline face and hydrogen silsequioxane (HSQ).

As mentioned first, to increase the sensitivity, resistance at the tip of the probe should show a much smaller value than that below such that most of current flows through the tip of the probe. To this end, unlike a depletion type probe according to the related art, an enhancement type probe is manufactured. In addition, to reduce resistance of the source/drain regions and exclude the possibility of punch-through current so as to advantageously facilitate to detect electric charges and write in ferroelectrics, a pyramid type shape is maintained.

Detailed description will now be made of the method of manufacturing the enhancement type semiconductor probe using an anisotropic wet etching and a side-wall according to an exemplary embodiment of the present invention referring to FIGS. 3A to 3Q.

Figure 3A:
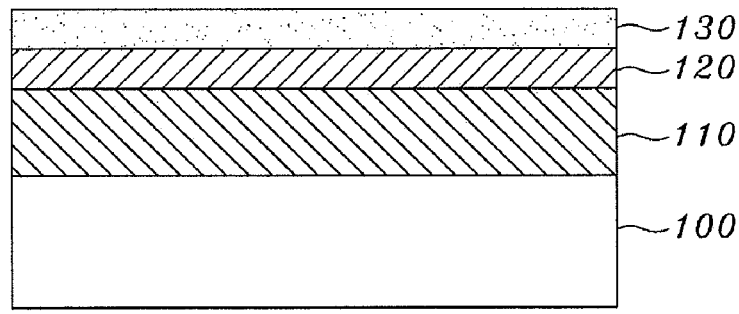
FIGS. 3A-3E, 3I, 3J, 3M-3Q, 3T and 3U are sectional process views

First, as shown in FIG. 3A, a first etching mask layer 110, a second etching mask layer 120, and a photosensitive layer 130 are sequentially laminated on a silicon substrate 100. Herein, the first and second etching mask layers 110 and 120 each are composed of a material having different etching selectivity. For example, the first etching mask layer 110 is composed of silicon oxide ($SiO_2$), and the second etching mask layer 120 is composed of nitrides ($SiN_x$). The reason why a mask is formed as silicon oxide ($SiO_2$) and nitrides ($SiN_x$) is because the two materials have excellent etching selectivity to silicon with respect to etching solutions KOH and TMAH that are generally used in an anisotropic etching to be carried out subsequently.

Figure 3B:
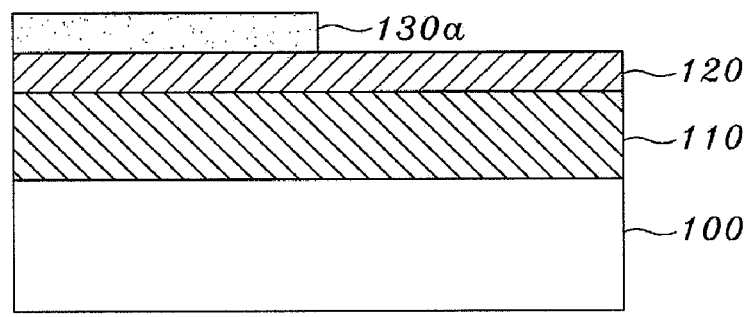

Next, as shown in FIG. 3B, the photosensitive layer 130 is performed with exposure, development, and etching using a mask (not shown) so as to form a patterned photosensitive layer 130a.

Figure 3C:
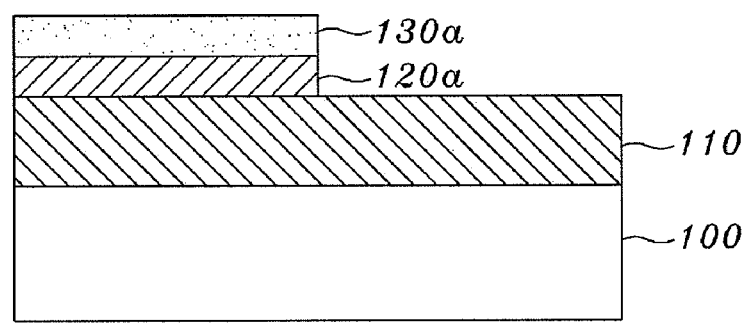

Next, as shown in FIG. 3C, the second etching mask layer 120 is etched into a patterned second etching mask layer 120a by a photo and dry-etching process using the patterned photosensitive layer 130a as an etching mask.

Figure 3D:
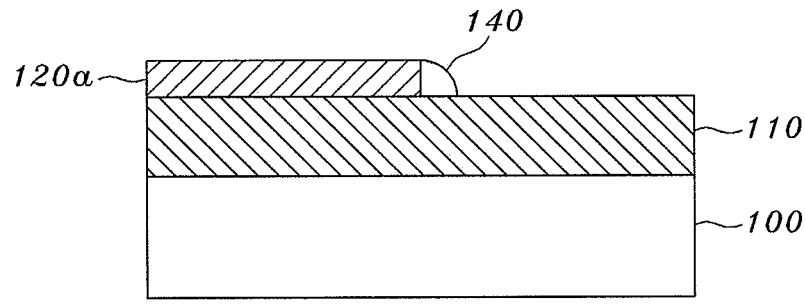

Then, as shown in FIG. 3D, the photosensitive layer 130a is removed, and a nitride is laminated on a sidewall of the second etching mask layer 120a to form a spacer layer 140.

Figure 3E:
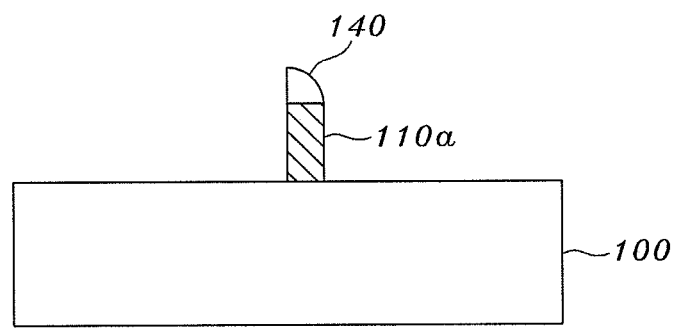

Then, as shown in FIG. 3E, the second etching mask layer 120a is removed, and the first etching mask layer 110 is etched using the spacer layer 140 as an etching mask.

Figure 3F:
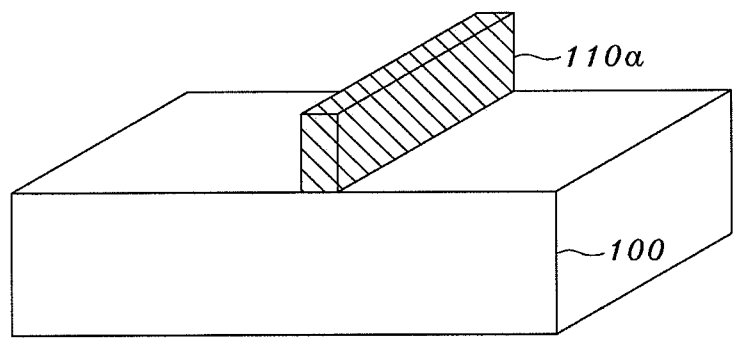
FIGS. 3F-3H, 3K, 3L, 3R, 3S and 3V are perspective process views illustrating a method of manufacturing an enhancement type semiconductor probe using an anisotropic wet etching and a side-wall according to an exemplary embodiment of the present invention.

Subsequently, the spacer layer 140 is removed so that the first etching mask pattern layer 110a is formed on the silicon substrate 100 as shown in FIG. 3F.

Figure 3G:
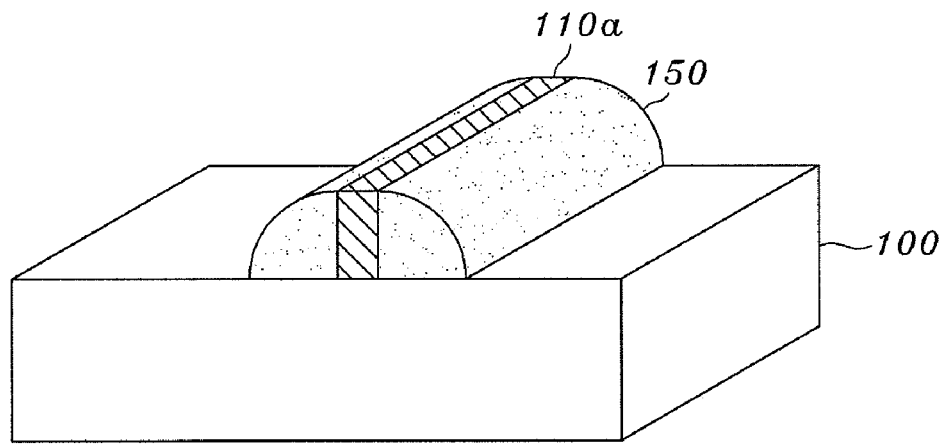
Figure 3H:
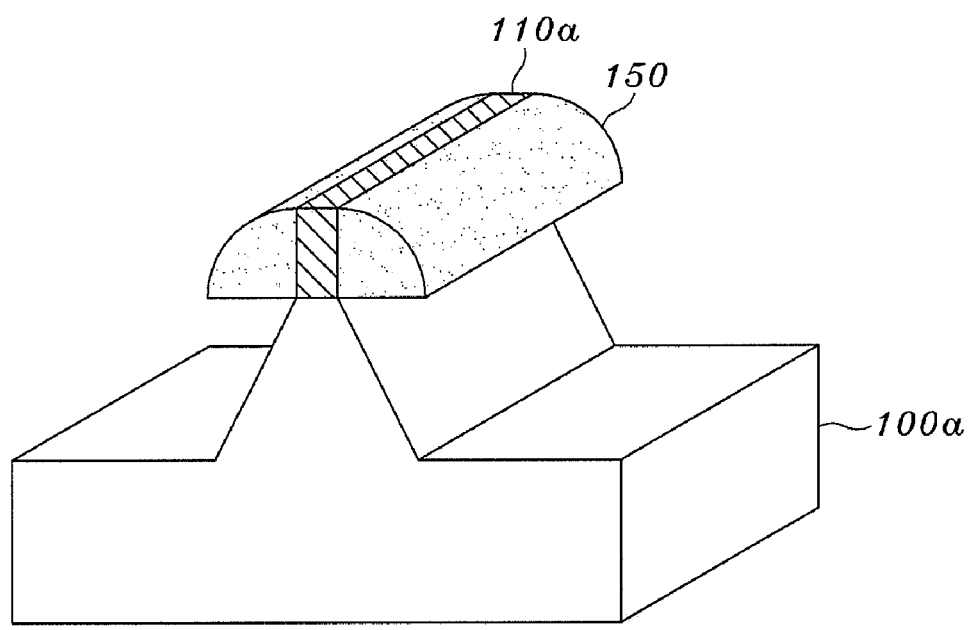
Figure 3I:
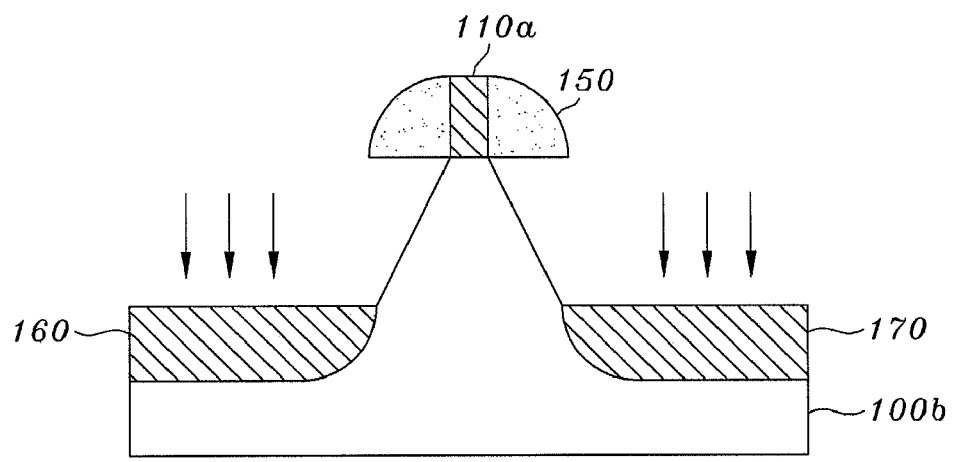

Next, after a nitride is laminated on the first etching mask pattern layer 110a formed on the silicon substrate 100, an etching is performed again to form sidewalls 150 on both sides of the first etching mask pattern layer 110a (See FIG. 3G).

Then, as shown in FIG. 3H, the silicon substrate 100 is anisotropically etched into an etched silicon substrate 100a by dry or wet-etching using the sidewalls 150 formed on both sides of the first etching mask pattern layer 110a to form both inclined faces of a probe.

Next, as shown in FIG. 3I, impurities in proper concentration are implanted into the exposed silicon substrate 100b using the sidewalls 150 as a mask to form deep source/drain regions 160 and 170.

Figure 3J:
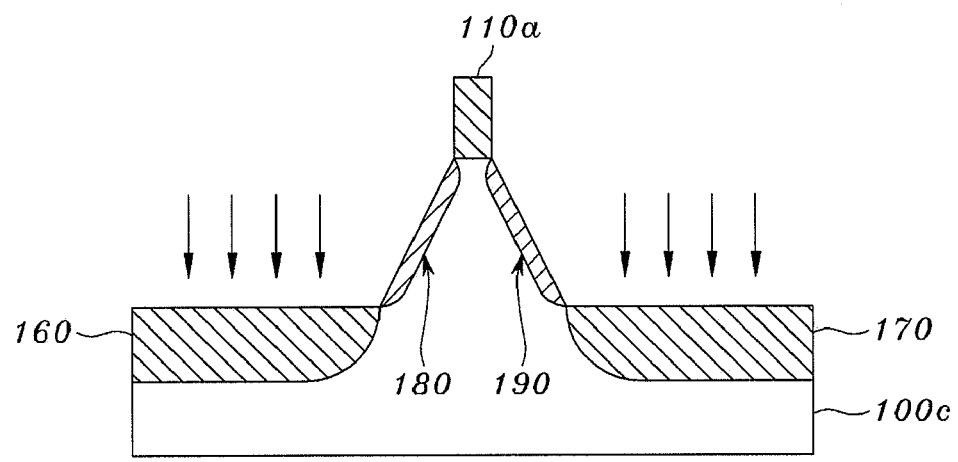

Then, as shown in FIG. 3J, after the sidewalls 150 made of nitride are removed, impurities in proper concentration are implanted into the exposed silicon substrate 100b to form silicon substrate 100c using the first etching mask pattern layer 110a as a mask to form shallow source/drain regions 180 and 190 on the both inclined faces of the semiconductor probe.

Meanwhile, FIGS. 3K to 3V show sectional process views illustrating the process of forming the probe tip shaped like a pyramid in its width direction. Here, since anisotropic etching has already been previously done, it is difficult to perform an anisotropic etching again in another direction so as to shape the tip as a pyramid, a following HSQ transfer method is used to shape the pyramid type probe tip.

Figure 3K:
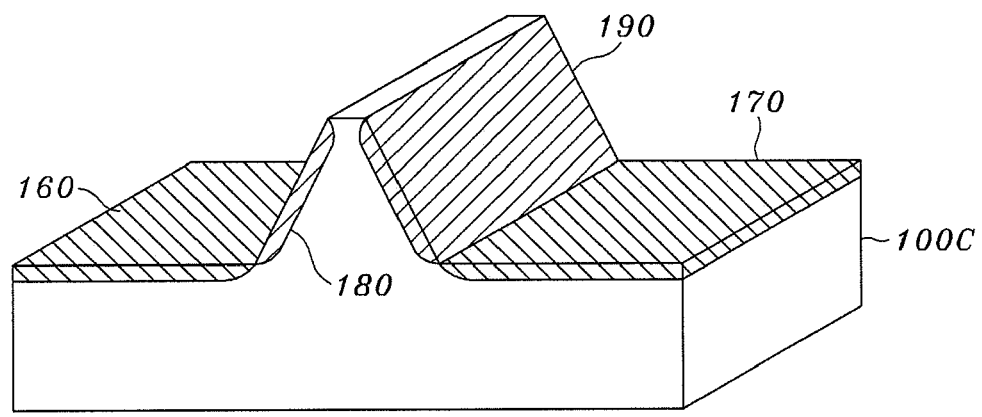
Figure 3L:
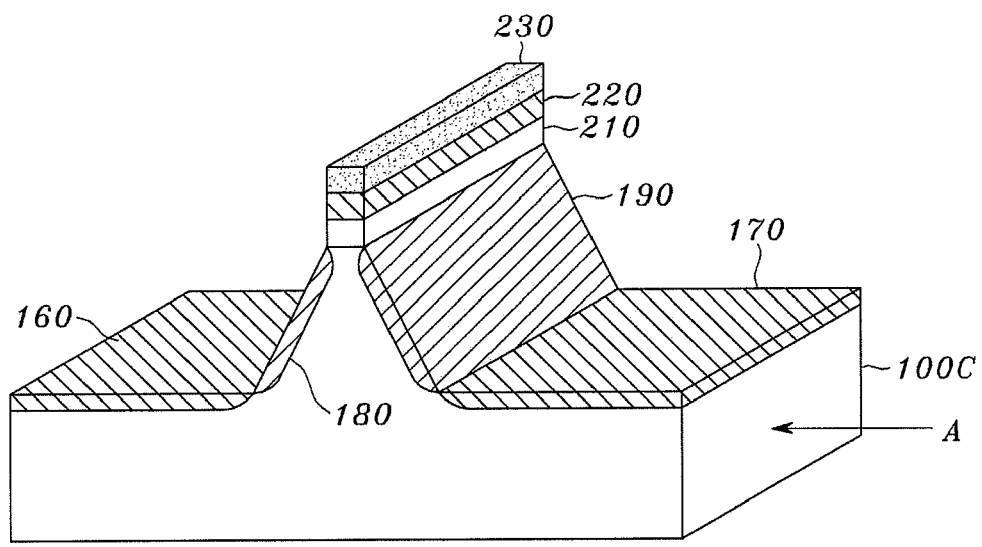

First, as shown in FIG. 3K, the first etching mask pattern layer 110a is removed. Then, as shown in FIG. 3L, third etching mask layer 210, a fourth etching mask layer 220, and a photosensitive layer 230 are sequentially laminated on the silicon substrate 100c. Herein, as is the same case as above, the third and fourth etching mask layers 210 and 220 each are preferably composed of a material having different etching selectivity. For example, the third etching mask layer 210 is composed of silicon oxide ($SiO_2$), and the fourth etching mask layer 220 is composed of silicon nitrides ($SiN_x$). The reason why a mask is formed as silicon oxide ($SiO_2$) and nitrides ($SiN_x$) is because the two materials have excellent etching selectivity to silicon with respect to etching solutions KOH and TMAH that are generally used in an anisotropic etching to be carried out subsequently.

Figure 3M:
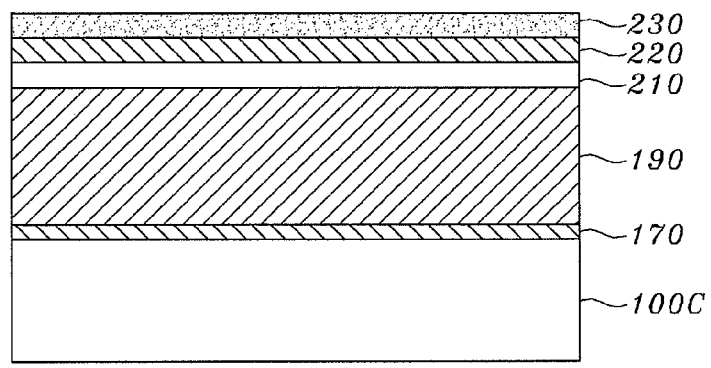

FIG. 3M shows a sectional shape of the semiconductor probe as viewed in a direction A in FIG. 3L.

Figure 3N:
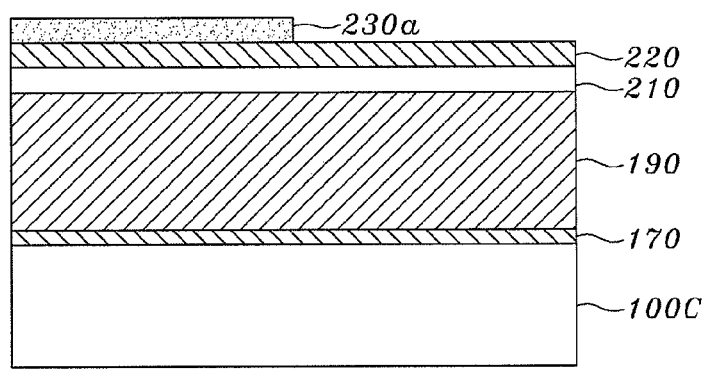
Figure 3O:
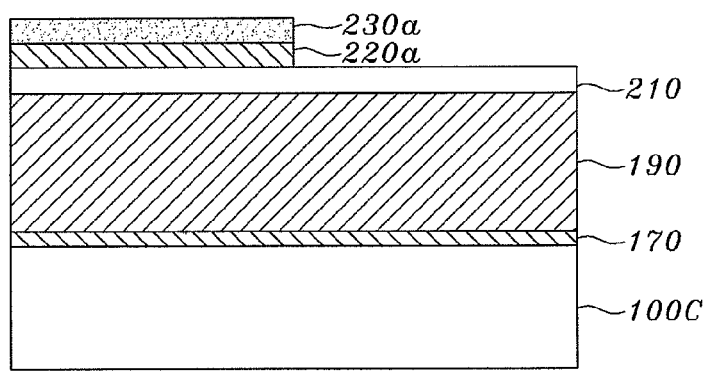

Next, as shown in FIG. 3N, the photosensitive layer 230 is performed with exposure, development, and etching using a mask (not shown) so as to form a patterned photosensitive layer 230a. As shown in FIG. 3O, the fourth etching mask layer 220 is etched by a photo and dry-etching process using the patterned photosensitive layer 230a as an etching mask to form patterned fourth etching mask layer 220a.

Figure 3P:
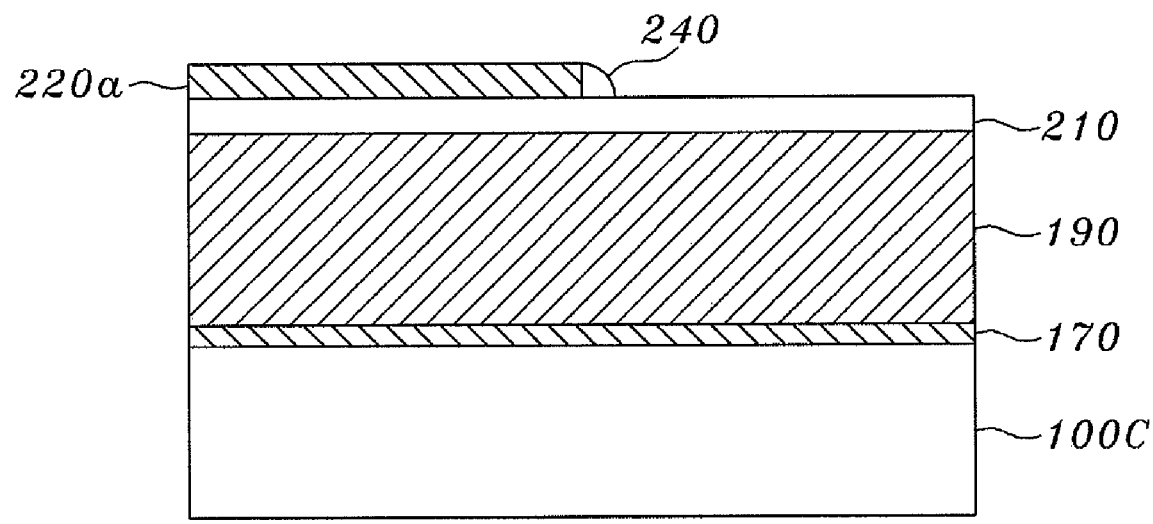

Then, as shown in FIG. 3P, the photosensitive layer 230a is removed, and a nitride is laminated on a sidewall of the fourth etching mask layer 220a to form a spacer layer 240.

Figure 3Q:
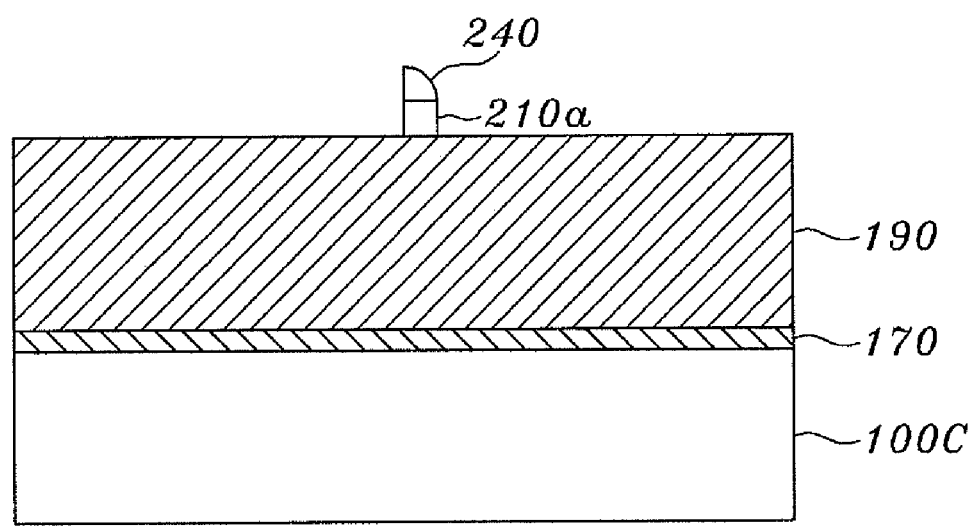
Figure 3R:
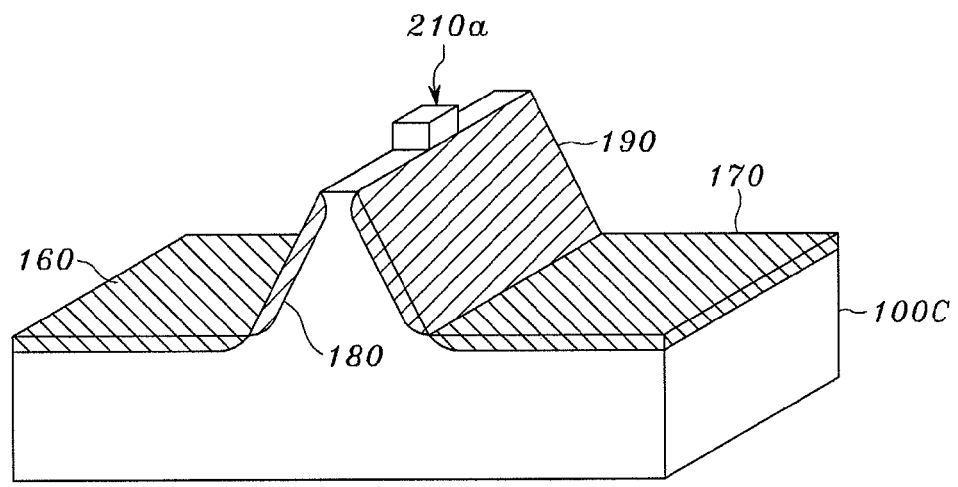

Then, as shown in FIG. 3Q, the fourth etching mask layer 220a is removed, and the third etching mask layer 210 is etched using the spacer layer 240 as an etching mask to form third etching mask pattern layer 210a. Subsequently, the spacer layer 240 is removed to form a third etching mask pattern layer 210a on the silicon substrate 100c as shown in FIG. 3R.

With the above method, a patterned line width can be determined from a thickness dimension of a film, so that a line pattern of approximately 10 nm can be easily formed. In addition, in that case, for example, an $SiO_2$ pattern generally having a line pattern of 20 to 30 nm can be easily formed from the thickness of the spacer layer.

Figure 3S:
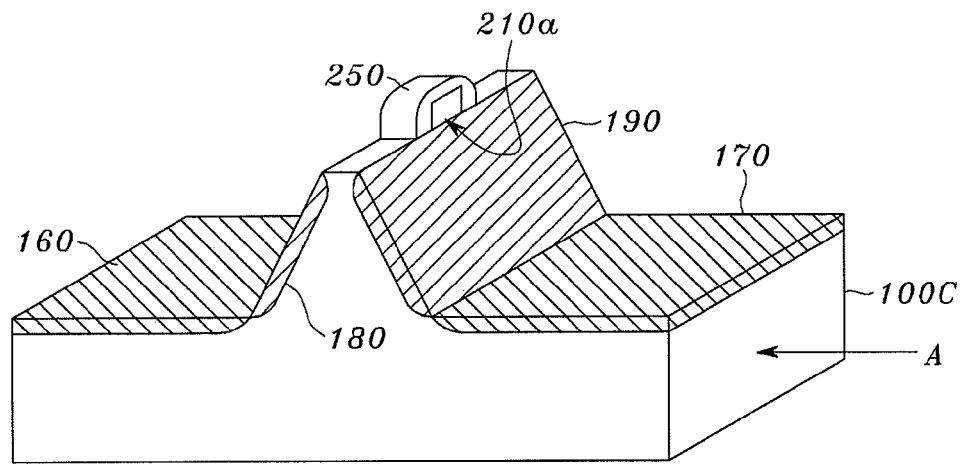

Then, as shown in FIG. 3S, a hydrogen silsequioxane (HSQ) solution is added so as to sufficiently bury the third etching mask pattern layer 210a. Subsequently, it is done to allow a spacer layer (or HSQ) 250 to be formed on both sides of the third mask pattern layer 210a, and to remove the other portion using a mask (not shown).

Meanwhile, the spacer layer 250 is made of a material that has a good planarization characteristic and/or is easy to control the etching selectivity to silicon. The HSQ is useful in controlling the etching selectivity to silicon substrate even if uneven, so that the probe structure is easily formed.

Figure 3T:
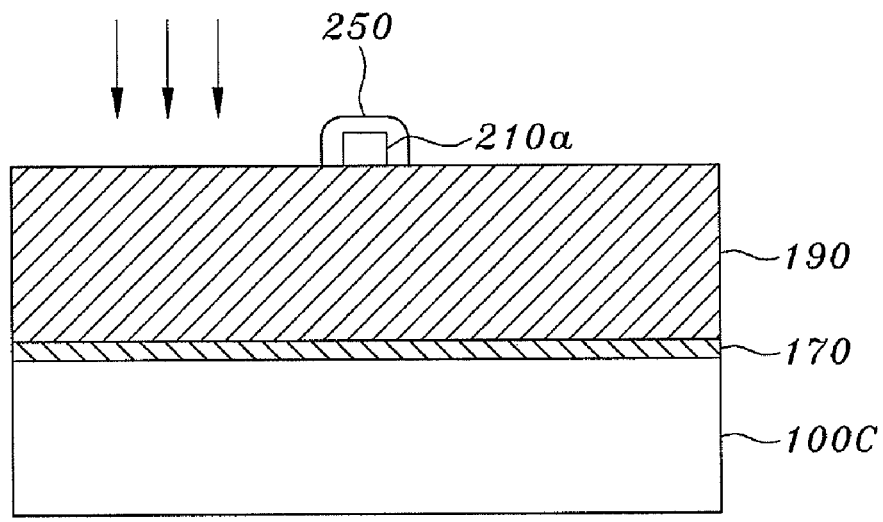
Figure 3U:
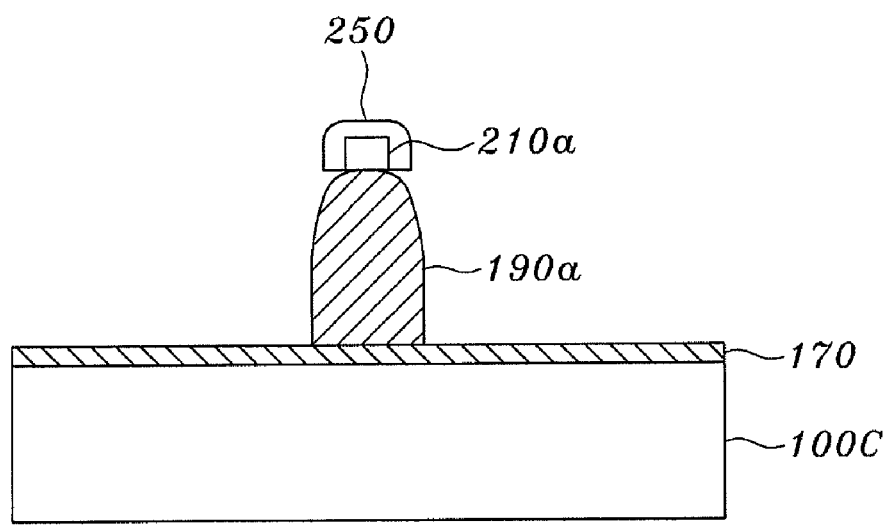
Figure 3V:
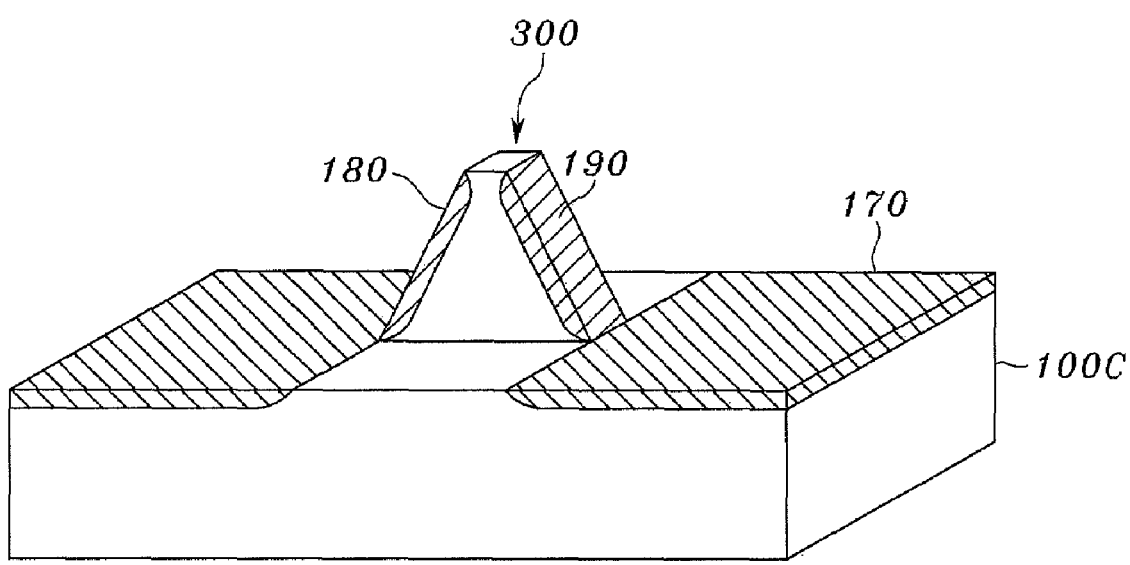

FIG. 3T shows a sectional shape of the semiconductor probe as viewed in a direction A shown in FIG. 3S. As shown in FIG. 3T, when the silicon substrate 100c is etched using the HSQ transfer method, the HSQ 250 having poor etching selectivity is etched together with the silicon substrate 100c to form an inclined shape 300 as shown in FIGS. 3U and 3V.

Here, since anisotropic etching has already been previously done, it is difficult to perform an anisotropic etching again in another direction so as to shape the tip as a pyramid, the HSQ transfer method is used to shape the pyramid type probe tip.

Figure 4:
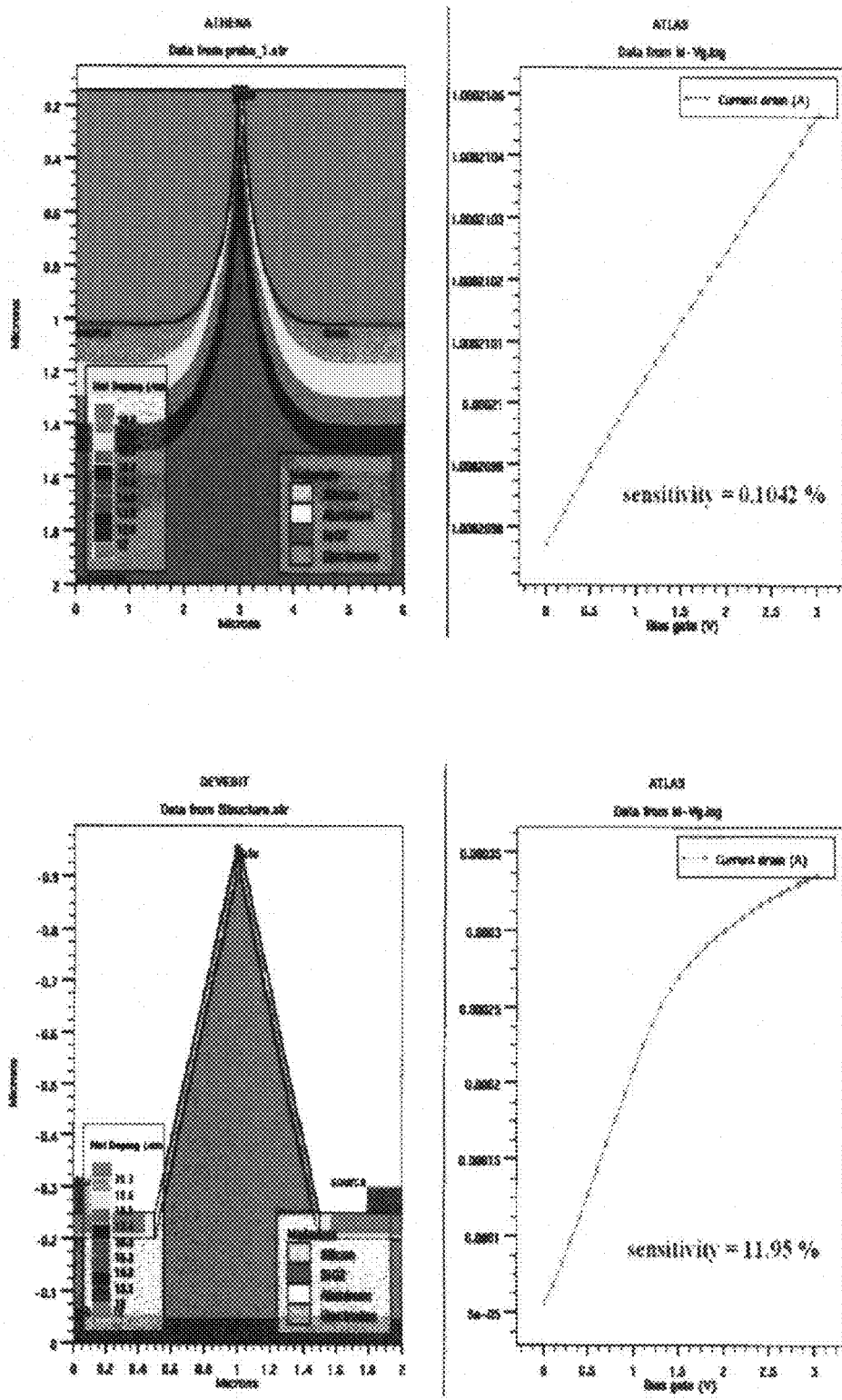
FIG. 4 is a graphical diagram illustrating a comparison result of the simulation between related art and an exemplary embodiment of the present invention.

FIG. 4 is a graphical diagram illustrating a comparison result of the simulation between the related art and the exemplary embodiment of the present invention. As can be seen from FIG. 4, the device sensitivity of the exemplary embodiment of the present invention is increased about 100 times as the related art.

$$S=\{I(V_g=1V)-I(V_g=0V)\}/I(V_g=0V) \quad (1)$$

As set forth before, according to the method of manufacturing the enhancement type semiconductor probe using the anisotropic wet etching and the sidewall, and the information storage device having the semiconductor probe manufactured by the same method, influence of process parameters upon the performance of a device is reduced to improve reliability of the device in mass-production, and factors of degrading measuring sensitivity is removed to improve the performance of the device.

Moreover, according to the exemplary embodiment of the present invention, a probe having sufficient ON/OFF current ratio is manufactured, which contributes to improvements in device sensitivity.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing an enhancement type semiconductor probe comprising:
    forming, on a silicon substrate, a first etching mask pattern for forming a tip portion of a probe in a first direction and forming side-walls on both sides of the first etching mask pattern;
    anisotropically etching the silicon substrate using the side-walls to form inclined faces of the probe;
    implanting impurities into the silicon substrate using the side-walls as a mask to form source and drain regions and removing the side-walls;
    forming source and drain regions on the inclined faces of the probe using the first etching mask pattern as a mask and removing the first etching mask pattern;
    forming, on the tip portion of the probe, a third etching mask pattern for forming a tip portion of the probe in a second direction;
    forming spacer layers on both sides of the second etching mask pattern; and
    etching the silicon substrate in a certain depth by a photolithography using the spacer layers and removing the spacer layers.

2. The method according to claim 1, wherein the method of forming the first etching mask pattern comprises:
    sequentially depositing a first etching mask layer, a second etching mask layer, and a photosensitive layer on the silicon substrate;
    patterning the photosensitive layer and etching the second etching mask layer using a photolithography;
    removing the photosensitive layer and forming a spacer layer on a side-wall of the second etching mask layer;
    removing the second etching mask layer and etching the first etching mask layer using the spacer layer; and
    removing the spacer layer to form the first etching mask pattern.

3. The method according to claim 2, wherein the first and second etching mask layers each are composed of materials having different etch selectivity.

4. The method according to claim 3, wherein the first etching mask layer is composed of silicon oxide ($SiO_2$), and the second etching mask layer is composed of nitrides ($SiN_x$).

5. The method according to claim 1, wherein the method of forming the third etching mask pattern comprises:
    sequentially laminating a third etching mask layer, a fourth etching mask layer, and a photosensitive layer on the silicon substrate;
    patterning the photosensitive layer and etching the fourth etching mask layer using a photolithography;
    removing the photosensitive layer and forming a spacer layer on a side-wall of the fourth etching mask layer;
    removing the fourth etching mask layer and etching the third etching mask layer using the spacer layer formed on the side-wall of the fourth etching mask layer; and
    removing the spacer layer formed on the side-wall of the fourth etching mask layer to form the second etching mask pattern.

6. The method according to claim 5, wherein the third and fourth etching mask layers each are composed of materials having different etch selectivity.

7. The method according to claim 6, wherein the third etching mask layer is composed of silicon oxide ($SiO_2$), and the fourth etching mask layer is composed of nitrides ($SiN_x$).

8. The method according to claim 1, wherein the sidewalls are formed using nitrides ($SiN_x$).

9. The method according to claim 1, wherein the spacer layers are formed using hydrogen silsequioxane (HSQ).

10. An information storage device having the enhancement type semiconductor probe manufactured according to claim 1.

* * * * *